US011711899B2

(12) United States Patent
Zhang et al.

(10) Patent No.: US 11,711,899 B2
(45) Date of Patent: Jul. 25, 2023

(54) INSTALLATION STRUCTURES FOR TILED DISPLAYS AND TILED DISPLAYS

(71) Applicants: BOE MLED Technology Co., Ltd., Beijing (CN); BOE Technology Group Co., Ltd., Beijing (CN)

(72) Inventors: Gongtao Zhang, Beijing (CN); Xuerong Wang, Beijing (CN); Haiwei Sun, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/489,573

(22) Filed: Sep. 29, 2021

(65) Prior Publication Data
US 2022/0210931 A1 Jun. 30, 2022

(30) Foreign Application Priority Data
Dec. 24, 2020 (CN) .......................... 202023163115.2

(51) Int. Cl.
*H05K 5/00* (2006.01)
*H05K 5/02* (2006.01)

(52) U.S. Cl.
CPC ......... *H05K 5/0217* (2013.01); *H05K 5/0021* (2013.01)

(58) Field of Classification Search
USPC .......................... 361/730, 731, 807, 809, 810
See application file for complete search history.

(56) References Cited

U.S. PATENT DOCUMENTS

| 2020/0064677 | A1* | 2/2020 | Yoon | G09F 9/3026 |
| 2020/0196462 | A1* | 6/2020 | Kim | H05K 5/0021 |
| 2020/0320909 | A1* | 10/2020 | Perez-Bravo | G09F 9/301 |
| 2021/0033240 | A1* | 2/2021 | Choi | G09F 9/3026 |
| 2021/0076115 | A1* | 3/2021 | Choi | H04R 1/028 |

FOREIGN PATENT DOCUMENTS

| CN | 104505001 A | 4/2015 | |
| CN | 209328409 U | 8/2019 | |
| KR | 20140067771 | * 6/2014 | ............... G09F 9/00 |
| KR | WO2021100976 | * 5/2021 | ............. G09F 9/302 |

* cited by examiner

*Primary Examiner* — Hung S. Bui
(74) *Attorney, Agent, or Firm* — IPro, PLLC

(57) ABSTRACT

Installation structures for tiled displays and tiled displays are provided. A tiled display includes a plurality of sub-display panels each of which is installed on a respective installation structure. The installation structure includes: a frame body, on which a corresponding sub-display panel is installed; a movable part provided on an outer side of the frame body; and an adjustment rod, an end of which penetrates through the frame body and cooperates with the movable part, where the adjustment rod is rotatable relative to the frame body, and rotation of the adjustment rod can drive the movable part to move close to or away from the frame body. The tiled display includes the installation structure for the tiled display.

16 Claims, 4 Drawing Sheets

INSTALLATION STRUCTURES FOR TILED DISPLAYS AND TILED DISPLAYS

CROSS-REFERENCE TO RELATED APPLICATIONS

The present disclosure claims a priority to Chinese patent application No. 202023163115.2 filed on Dec. 24, 2020 and entitled "INSTALLATION STRUCTURES FOR TILED DISPLAYS AND TILED DISPLAYS", which is incorporated herein by reference in its entirety.

TECHNICAL FIELD

The present disclosure relates to the field of display technology, and in particular to an installation structure for a tiled display and a tiled display.

BACKGROUND

An individual display such as a mini LED display has a small display area due to a small size thereof. In order to achieve a large screen display, tiled display technology emerged. A tiled display may include a plurality of sub-display panels tiled together.

SUMMARY

According to a first aspect of embodiments of the present disclosure, there is provided an installation structure for a tiled display. The tiled display includes a plurality of sub-display panels each of which is installed on a respective installation structure. The installation structure includes:

a frame body, on which a corresponding sub-display panel is installed;

a movable part provided on an outer side of the frame body; and an adjustment rod, an end of which penetrates through the frame body and cooperates with the movable part, where the adjustment rod is rotatable relative to the frame body, and rotation of the adjustment rod can drive the movable part to move close to or away from the frame body.

In an embodiment, the frame body is provided with a recess in a side wall opposite to the movable part, and a portion of the movable part can enter the recess.

In an embodiment, the recess has a depth ranging from 3 mm to 10 mm; and/or a ratio of the depth of the recess to a size of a portion of the frame body where the recess is provided in a depth direction of the recess ranges from 40% to 60%; and/or a ratio of a length of the movable part to a size of the frame body in a length direction of the movable part ranges from 70% to 90%.

In an embodiment, the adjustment rod is threadedly connected with the frame body, and the adjustment rod is threadedly connected with the movable part, and the movable part is circumferentially limited relative to the frame body.

In an embodiment, the adjustment rod is threadedly connected with the frame body, and an end of the adjustment rod is inserted into the movable part, and the adjustment rod cooperates with the movable part such that the adjustment rod is rotatable relative to the movable part, and the adjustment rod is limited in an extension direction of the adjustment rod relative to the movable part.

In an embodiment, a first magnetic member is provided on a side wall of the movable part opposite to the frame body, and a second magnetic member is provided on a side wall of the frame body opposite to the movable part, and the first magnetic member and the second magnetic member are disposed opposite to each other, and the first magnetic member and the second magnetic member have a magnetic attraction therebetween.

In an embodiment, the movable part is provided on an outer side of each of two adjacent side walls of the frame body.

In an embodiment, the adjustment rod includes two or more adjustment rods, and a distance between two adjacent adjustment rods ranges from 50 mm to 100 mm.

According to a second aspect of embodiments of the present disclosure, there is provided a tiled display including:

a plurality of the installation structures as described above; and a plurality of sub-display panels in one-to-one correspondence with the plurality of installation structures, each of the sub-display panels being installed on a respective installation structure, where an edge of a side wall of the frame body where the movable part is not provided is substantially flush with an edge of the corresponding sub-display panel located on a same side.

In an embodiment, one of two adjacent installation structures has a first side wall, and the other one of the two adjacent installation structures has a second side wall abutting the first side wall, and one of the first side wall and the second side wall is provided with the movable part, and the other one of the first side wall and the second side wall is not provided with the movable part.

DETAILED DESCRIPTION

Figure 1:
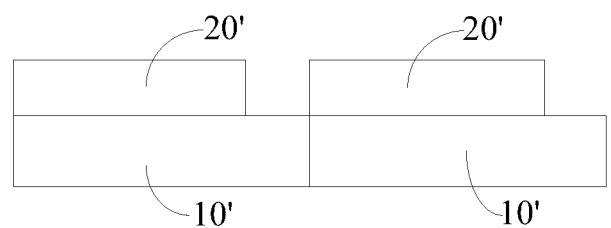
FIG. 1 is a schematic structural diagram illustrating a tiled display.

Exemplary embodiments will be described in detail herein, and examples thereof are illustrated in the drawings. When the following description refers to the drawings, the same numbers in different drawings indicate the same or similar elements, unless otherwise indicated. Implementations described in the following exemplary embodiments do not represent all implementations in accordance with the present disclosure. Rather, they are merely examples of apparatuses and methods in accordance with some aspects of the present disclosure as detailed in the appended claims.

Terms used in the present disclosure are only for the purpose of describing specific embodiments, and are not intended to limit the present disclosure. Singular forms of "a", "said" and "the" used in the present disclosure and the appended claims are also intended to include plural forms, unless the context clearly indicates otherwise. It should also be understood that the term "and/or" as used herein refers to and includes any or all possible combinations of one or more of the associated listed items.

It should be understood that though terms "first", "second", "third", etc. may be used in the present disclosure to describe various information, such information should not be limited by these terms. These terms are only used to distinguish the same type of information from each other. For example, without departing from the scope of the present disclosure, first information may also be referred to as second information, and similarly, second information may also be referred to as first information. Depending on the context, the word "if" as used herein may be interpreted as "when", "upon" or "in response to determining".

Figure 2:
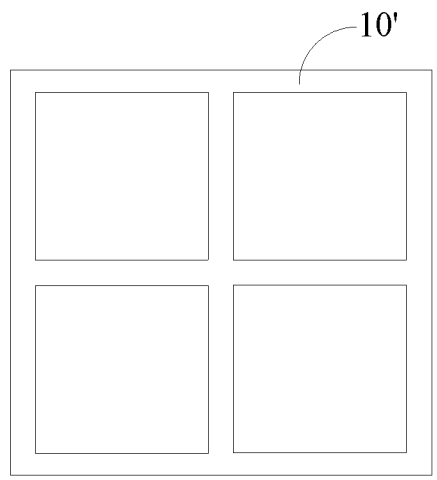
FIG. 2 is a top view illustrating an installation frame of the tiled display shown in FIG. 1.
Figure 3:
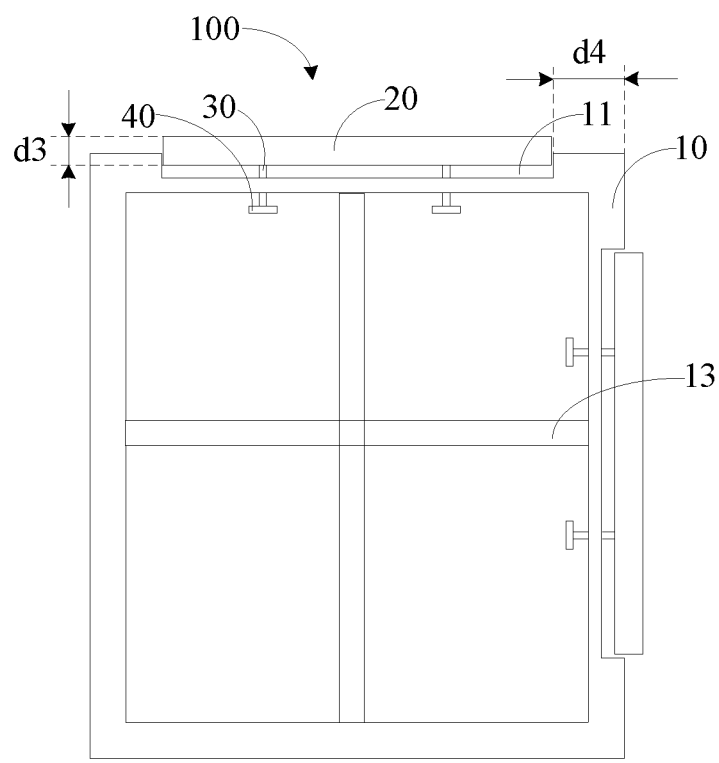
FIG. 3 is a schematic structural diagram illustrating an installation structure according to an exemplary embodiment of the present disclosure.
Figure 4:
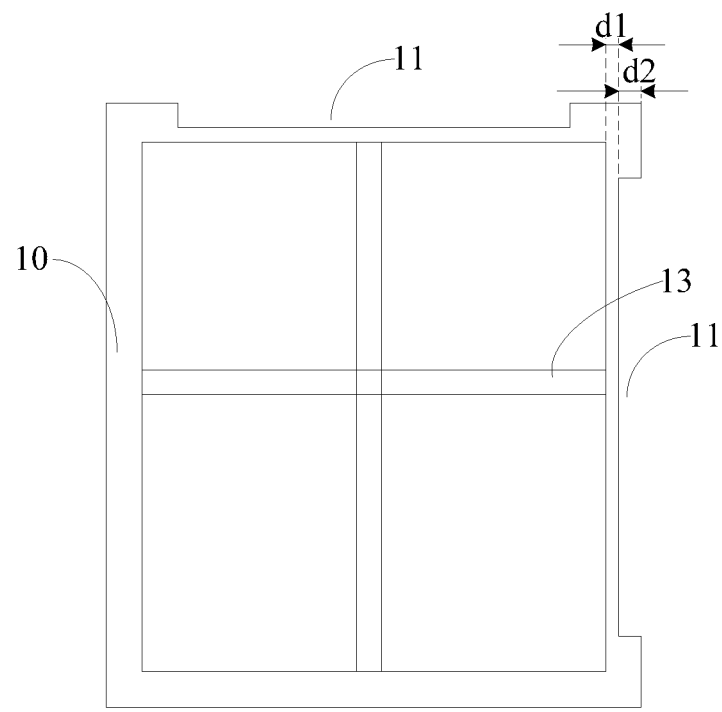
FIG. 4 is a plan view illustrating a frame body of the installation structure shown in FIG. 3.
Figure 5:
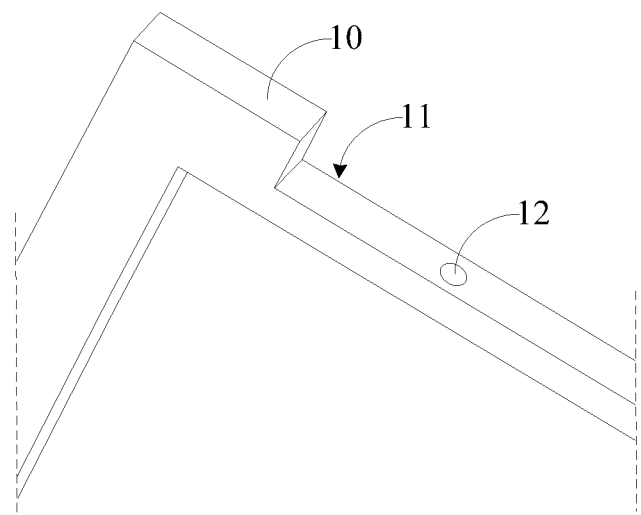
FIG. 5 is a schematic perspective view illustrating a partial structure of the frame body shown in FIG. 4.

FIG. 1 is a schematic structural diagram illustrating a tiled display, and FIG. 2 is a top view illustrating an installation frame of the tiled display shown in FIG. 1. Referring to FIG. 1, the tiled display includes a plurality of installation frames 10', and a plurality of sub-display panels 20' in one-to-one correspondence with the plurality of installation frames 10', and each of the sub-display panels 20' is installed on a respective installation frame 10'. The sub-display panel 20' may include a glass substrate, a pixel circuit provided on the glass substrate, and a light-emitting element provided on the pixel circuit.

Due to a brittle texture of the glass substrate, glass substrates of adjacent sub-display panels may be broken if the glass substrates knock against each other during a tiling process. In order to prevent the glass substrates from knocking against each other, an edge of the sub-display panel may be generally set not to extend beyond a corresponding edge of the installation frame. In order to ensure that the edge of the sub-display panel does not extend beyond the corresponding edge of the installation frame, the glass substrate may be designed to have a size reduction. Assuming that a size tolerance of the installation frame is 0.05 mm, a cutting tolerance of the glass substrate is 0.03 mm, and an installation error is 0.02 mm when the sub-display panel is installed on the installation frame, a design value L of the size reduction for the glass substrate may satisfy the following condition: L=0.05 mm+0.03 mm+0.02 mm=0.10 mm. Therefore, when the sub-display panels are tiled together, there is a gap of 0.10 mm between the adjacent sub-display panels. If the installation error is 0 when the sub-display panel is installed on the installation frame, the design value L of the size reduction for the glass substrate may satisfy the following condition: L=0.05 mm+0.03 mm=0.08 mm. When the sub-display panels are tiled together, there is still a gap of 0.08 mm between the adjacent sub-display panels.

As can be seen, there is a relatively large gap between the adjacent sub-display panels in the above-described tiled display, which affects a display effect of the tiled display and is not conducive to enhancing a user experience.

Embodiments of the present disclosure provide an installation structure for a tiled display and a tiled display. The installation structure for the tiled display and the tiled display according to the embodiments of the present disclosure will be described in detail below. Features in the following embodiments may complement each other or be combined with each other without conflict.

Embodiments of the present disclosure provide an installation structure for a tiled display. The tiled display includes a plurality of sub-display panels each of which is installed on a respective installation structure. Referring to FIGS. 3-7, the installation structure 100 includes a frame body 10, a movable part 20, and an adjustment rod 30. A corresponding sub-display panel is installed on the frame body 10. The movable part 20 is provided on an outer side of the frame body 10. An end of the adjustment rod 30 penetrates through the frame body 10 and cooperates with the movable part 20. The adjustment rod 30 is rotatable relative to the frame body 10, and rotation of the adjustment rod 30 can drive the movable part 20 to move close to or away from the frame body 10.

Figure 8:
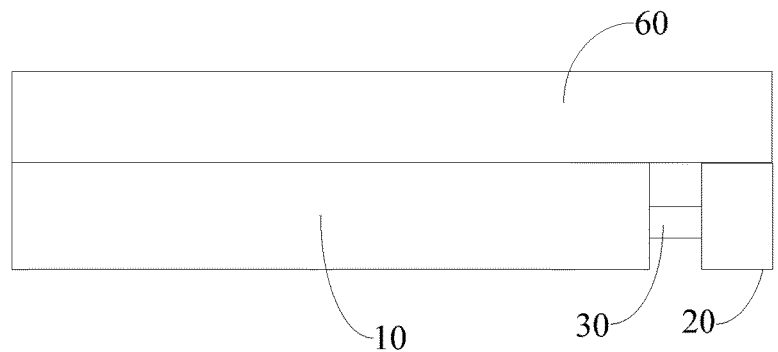
FIG. 8 is a schematic diagram illustrating a sub-display panel installed on an installation structure according to an exemplary embodiment of the present disclosure.

In the installation structure for the tiled display according to the embodiments of the present disclosure, a movable part 20 is provided on an outer side of a frame body 10, and rotation of an adjustment rod 30 can drive the movable part 20 to move close to or away from the frame body 10. Rotating the adjustment rod 30 may adjust a position of the movable part 20 such that an outer edge of the movable part 20 is substantially flush with an edge of the sub-display panel 60 installed on the installation structure, as shown in FIG. 8. When the sub-display panels are tiled together, adjacent installation structures 100 abut against each other, and the outer edge of the movable part 20 is substantially flush with the edge of the sub-display panel, such that there is a small gap or no gap between adjacent sub-display panels, which is conducive to improving a display effect of the tiled display and enhancing a user experience.

In some embodiments, the frame body 10 may be provided with a through hole 12, through which the adjustment rod 30 passes.

In some embodiments, a thickness of the movable part 20 may be the same as a thickness of the frame body 10. In this way, both the frame body 10 and the movable part 20 may support the sub-display panel, and thus the installation structure 100 may have a better support effect on the sub-display panel.

In some embodiments, a middle area of the frame body 10 may be hollowed out to facilitate connection of the sub-display panel with a circuit board. The frame body 10 may further include a support bar 13 provided inside thereof, and the support bar 13 may enhance strength of the frame body 10.

In some embodiments, the frame body 10 and the movable part 20 may be formed by die-casting or machine stamping.

In some embodiments, the frame body 10 may be provided with a recess 11 in a side wall opposite to the movable part 20, and a portion of the movable part 20 can enter the recess 11. A portion of the frame body 10 where the recess 11 is not provided may be set to have a relatively large width, to improve the strength of the frame body 10 and improve the support effect of the frame body 10 on the sub-display panel installed on the installation structure 100. When the position of the movable part 20 is adjusted by the adjustment rod 30 such that the outer edge of the movable part 20 is substantially flush with the edge of the sub-display panel, the movable part 20 may be pressed against a bottom wall of the recess 11 or be at a small distance from the bottom wall of the recess 11.

In some embodiments, the recess 11 may have a depth d2 ranging from 3 mm to 10 mm. This may avoid low strength of the frame body 10 due to a large depth of the recess 11 which causes a size d1 of a portion of the frame body 10 where the recess 11 is provided in a depth direction of the recess 11 to be small. In addition, when the position of the movable part 20 is adjusted by the adjustment rod 30 such that the outer edge of the movable part 20 is substantially flush with the edge of the sub-display panel, the movable part 20 mostly enters into the recess 11, and a distance between the outer edge of the movable part 20 and an outer edge of the frame body 10 is small. By setting the depth of the recess 11 in the range of 3 mm to 10 mm, it is also possible to avoid low strength of the movable part 20 due to a small depth of the recess 11 which causes a size of the movable part 20 to be small in a moving direction of the movable part 20. In some embodiments, the depth of the recess 11 may be 3 mm, 5 mm, 7 mm, 9 mm, 10 mm, etc.

In some embodiments, a ratio of the depth d2 of the recess 11 to the size d1 of the portion of the frame body 10 where the recess 11 is provided in the depth direction of the recess 11 may range from 40% to 60%. This may avoid low strength of the frame body 10 due to a large depth of the recess 11 which causes a width of a portion of the frame body 10 where the recess 11 is provided to be small. This may also avoid low strength of the movable part 20 due to a small depth of the recess 11 which causes a size of the movable part 20 to be small in a moving direction of the movable part 20. In some embodiments, the ratio of the depth of the recess 11 to the size of the portion of the frame body 10 where the recess 11 is provided in the depth direction of the recess 11 may be 40%, 45%, 50%, 55%, 60%, etc.

In some embodiments, the size d3 of the movable part 20 in the moving direction of the movable part 20 may range from 5 mm to 10 mm. The size of the movable part 20 in the moving direction of the movable part 20 may be slightly larger than the depth of the recess 11. This may avoid low strength of the movable part 20 due to a small size of the movable part 20 in the moving direction of the movable part 20. This may also avoid low strength of the frame body 10 due to a large size of the movable part 20 in the moving direction of the movable part 20 which causes the depth of the recess 11 to be large. In some embodiments, the size d3 of the movable part 20 in the moving direction of the movable part 20 may be 5 mm, 6 mm, 7 mm, 8 mm, 9 mm, 10 mm, etc.

In some embodiments, a ratio of a length of the movable part 20 to a size of the frame body 10 in a length direction of the movable part 20 may range from 70% to 90%. A size of the recess 11 in the length direction of the movable part 20 may be substantially the same as the length of the movable part 20. Four corners of the frame body 10 may not be provided with recesses for bonding with the sub-display panel through an adhesive layer to prevent the sub-display panel from moving and overhanging relative to the frame body 10. This may avoid an unstable bonding between the frame body 10 and the sub-display panel due to a large ratio of the length of the movable part 20 to the size of the frame body 10 in the length direction of the movable part 20 which causes portions of the frame body 10 provided with no recesses to have a small area and thus an area of the frame body 10 that may be provided with the adhesive layer to be small. This may also avoid a poor support effect of the movable part 20 on the edge of the sub-display panel due to a small length of the movable part 20. In some embodiments, the ratio of the length of the movable part 20 to the size of the frame body 10 in the length direction of the movable part 20 may be 70%, 75%, 80%, 85%, 90%, etc.

In some embodiments, a size d4 of a corner portion of the frame body 10 without the recess in the length direction of the movable part 20 may range from 10 mm to 50 mm. Further, the size d4 of the corner portion of the frame body 10 without the recess in the length direction of the movable part 20 may range from 10 mm to 30 mm. In some embodiments, the size d4 of the corner portion of the frame body 10 without the recess in the length direction of the movable part 20 may be 10 mm, 20 mm, 30 mm, 40 mm, 50 mm, etc.

In some embodiments, an end of the adjustment rod 30 away from the frame body 10 is located outside of the frame body 10. The movable part 20 is provided with an opening 21 therein, and the end of the adjustment rod 30 away from the frame body 10 enters the opening 21.

In some embodiments, two or more adjustment rods 30 may cooperate with a common movable part 20, and penetrate through the frame body 10, and a distance between two adjacent adjustment rods 30 may range from 50 mm to 100 mm. In this way, the position of the common movable part 20 may be adjusted by adjusting the two or more adjustment rods 30, which may improve a balance of the movable part 20 during adjustment. By setting the distance between two adjacent adjustment rods 30 in the range of 50 mm to 100 mm, the balance of the movable part 20 may be further improved during adjustment. The distance between two adjacent adjustment rods 30 may be, for example, 50 mm, 60 mm, 70 mm, 80 mm, 90 mm, 100 mm, etc.

In some embodiments, an end of the adjustment rod 30 away from the movable part 20 is located inside of the frame body 10. The installation structure 100 may further include an expansion portion 40 connected with the end of the adjustment rod 30 located inside of the frame body 10. A user may operate the expansion portion 40 to rotate the adjustment rod 30. The expansion portion 40 may be detachably connected with the adjustment rod 30 by, for example, a screw thread. The expansion portion 40 may be a nut. Alternatively, the expansion portion 40 may be integrally formed with the adjustment rod 30.

Figure 6:
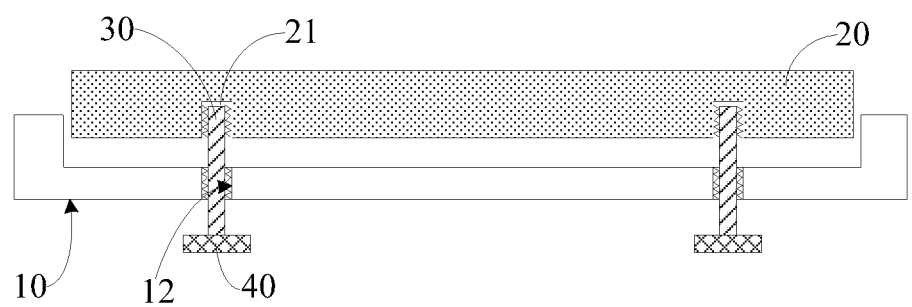
FIG. 6 is a partial cross-sectional view illustrating an installation structure according to an exemplary embodiment of the present disclosure in an assembled state.

In an embodiment, as shown in FIG. 6, the adjustment rod 30 may be threadedly connected with the frame body 10, and the adjustment rod 30 may be threadedly connected with the movable part 20, and the movable part 20 may be circumferentially limited relative to the frame body 10. The movable part 20 is circumferentially limited relative to the frame body 10, which means the movable part 20 and the frame body 10 may be moved relative to each other in a length direction of the adjustment rod 30, but the movable part 20 and the frame body 10 may not be rotated relative to each other. When adjusting the position of the movable part 20, the frame body 10 is fixed and the adjustment rod 30 may be rotated relative to the frame body 10. Since the frame body 10 is fixed and the movable part 20 and the frame body 10 may not be rotated relative to each other, the movable part 20 cannot rotate, then rotation of the adjustment rod 30 may drive the movable part 20 to move in an extension direction of the adjustment rod 30, such that the movable part 20 may move away from or close to the frame body 10. Threads on a wall of the through hole 12 in the frame body 10 may be realized by providing, inside the through hole 12 in the frame body 10, an annular structure, which has an inner surface provided with threads and a smooth outer surface, and is in an interference fit with the through hole 12 in the frame body 10. In this way, when the adjustment rod 30 is rotated relative to the frame body 10, the adjustment rod 30 may move relative to the frame body 10 in the extension direction thereof. When the end of the adjustment rod 30 away from the frame body 10 moves close to the frame body 10, the rotation of the adjustment rod 30 may drive the movable part 20 to move away from the frame body 10; and when the end of the adjustment rod 30 away from the frame body 10 moves away from the frame body 10, the rotation of the adjustment rod 30 may drive the movable part 20 to move close to the frame body 10.

When assembling the adjustment rod 30, the movable part 20 and the frame body 10 together, the end of the adjustment rod 30 first passes through the through hole 12 in the frame body 10 and is threaded to the movable part 20, and then the annular structure is rotated to enter into the through hole 12 in the frame body 10 and is threaded to the adjustment rod 30.

In some embodiments, as a way to circumferentially limit the movable part 20 relative to the frame body 10, two or more adjustment rods 30 penetrate through the frame body 10 and are threadedly connected with the movable part 20. In this way, the movable part 20 cannot be rotated with respect to the frame body 10. In other embodiments, the movable part 20 may be circumferentially limited relative to the frame body 10 in other ways.

Figure 7:
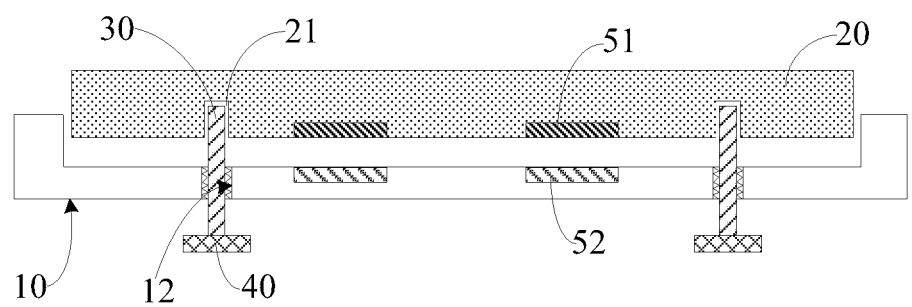
FIG. 7 is a partial cross-sectional view illustrating an installation structure according to another exemplary embodiment of the present disclosure in an assembled state.

In another embodiment, as shown in FIG. 7, the adjustment rod 30 may be threadedly connected with the frame body 10, and an end of the adjustment rod 30 may be inserted into an opening 21 in the movable part 20, which has a smooth inner wall. The adjustment rod 30 may cooperate with the movable part 20 such that the adjustment rod 30 is rotatable relative to the movable part 20, and the adjustment rod 30 may be limited in an extension direction of the adjustment rod 30 relative to the movable part 20. The adjustment rod 30 is limited in the extension direction of the adjustment rod 30 relative to the movable part 20, which means there is no relative movement or substantially no relative movement between the adjustment rod 30 and the movable part 20 in the extension direction of the adjustment rod 30. The adjustment rod 30 is threadedly connected with the frame body 10, and when the adjustment rod 30 is rotated relative to the frame body 10, the adjustment rod 30 moves relative to the frame body 10 in the extension direction thereof and thus drives the movable part 20 to move relative to the frame body 10 in the extension direction of the adjustment rod 30, such that the adjustment rod 30 moves close to or away from the frame body 10.

In some embodiments, a first magnetic member 51 may be provided on a side wall of the movable part 20 opposite to the frame body 10, and a second magnetic member 52 may be provided on a side wall of the frame body 10 opposite to the movable part 20. The first magnetic member 51 and the second magnetic member 52 may be disposed opposite to each other, and the first magnetic member 51 and the second magnetic member 52 may have a magnetic attraction therebetween. In this way, when the adjustment rod 30 is rotated relative to the frame body 10, the adjustment rod 30 moves relative to the frame body 10 in the extension direction thereof. When the end of the adjustment rod 30 away from the frame body 10 moves close to the frame body 10, the magnetic attraction between the first magnetic member 51 and the second magnetic member 52 may drive the movable part 20 to move close to the frame body 10; and when the end of the adjustment rod 30 away from the frame body 10 moves away from the frame body 10, a pushing force of the adjustment rod 30 acting on the movable part 20 may cause the movable part 20 to move away from the frame body 10. The magnetic attraction between the first magnetic member 51 and the second magnetic member 52 may prevent the movable part 20 from being separated from the adjustment rod 30. The first magnetic member 51 and the second magnetic member 52 may enable the adjustment rod 30 to be limited in the extension direction of the adjustment rod 30 relative to the movable part 20.

When assembling the frame body 10, the movable part 20 and the adjustment rod 30 together, the adjustment rod 30 first penetrates through the frame body 10, and then a portion of the adjustment rod 30 extending out of the frame body 10 is inserted into the opening 21 in the movable part 20.

In some embodiments, a plurality of first magnetic members 51 may be provided on the side wall of the movable part 20 opposite to the frame body 10, and a plurality of second magnetic members 52 may be provided on the side wall of the frame body 10 opposite to the movable part 20 in one-to-one correspondence with the plurality of first magnetic members 51. Each first magnetic member 51 may be disposed opposite to a respective second magnetic member 52.

In some embodiments, one of the first magnetic member 51 and the second magnetic member 52 may be a magnetic member that may generate a magnetic field by itself, and the other may be a magnetic member that may generate a magnetic field by itself or a magnetic member that may be magnetized in a magnetic field, for example, one is a permanent magnet, and the other is a magnetic member made of a magnetically attractable metal, such as iron, cobalt, nickel and alloys thereof. Alternatively, the first magnetic member 51 and the second magnetic member 52 may be both permanent magnets with magnetism opposite to each other.

Figure 9:
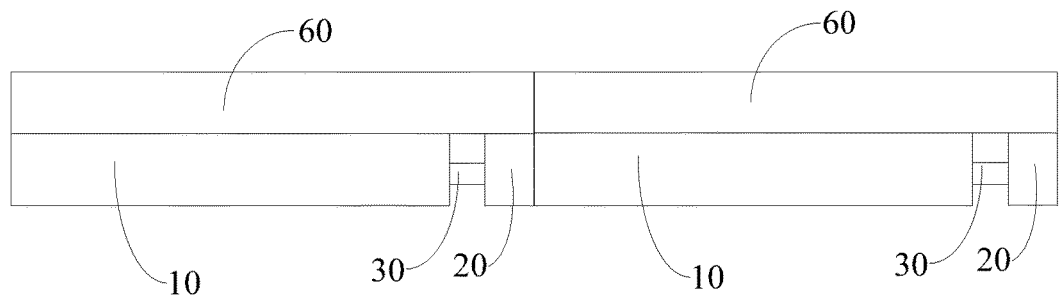
FIG. 9 is a schematic diagram illustrating sub-display panels according to an exemplary embodiment of the present disclosure after tiled together.

In some embodiments, the movable part 20 may be provided on an outer side of each of two adjacent side walls of the frame body 10, and the adjustment rods 30 penetrating through each of the two adjacent side walls may cooperate with a corresponding movable part 20. When the sub-display panel is installed on the frame body 10, two adjacent edges of the sub-display panel may be substantially flush with edges of two adjacent side walls of the frame body 10 where the movable part 20 and the adjustment rods 30 are not provided. The movable parts 20 on outer sides the other two side walls of the frame body 10 may be adjusted by the adjustment rods 30, such that outer edges of the movable parts 20 may be substantially flush with the other two edges of the sub-display panel. As shown in FIG. 9, when a plurality of sub-display panels 60 are tiled together, one of two adjacent installation structures 100 may have a first side wall, and the other may have a second side wall abutting the first side wall. One of the first side wall and the second side wall is not provided with the movable part and the adjustment rods with its edge substantially flush with an edge of the sub-display panel 60, and the other one of the first side wall and the second side wall is provided with the movable part 20 and the adjustment rods 30, and the outer edge of the movable part 20 is substantially flush with the edge of the sub-display panel by adjusting the adjustment rods 30, such that there is a small gap or no gap between adjacent sub-display panels.

Figure 10:
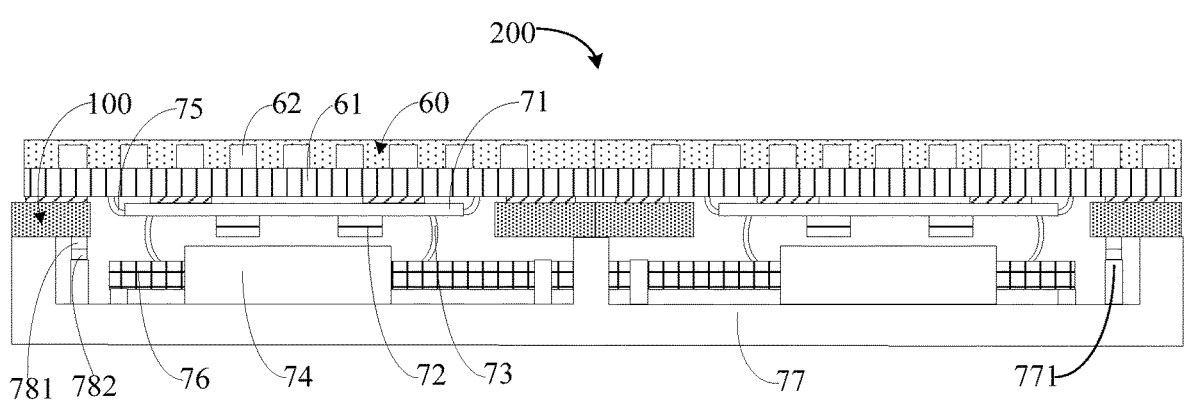
FIG. 10 is a schematic structural diagram illustrating a tiled display according to an exemplary embodiment of the present disclosure.

Embodiments of the present disclosure further provide a tiled display. Referring to FIG. 10, the tiled display 200 includes a plurality of the installation structures 100 according to any of the embodiments described above, and a plurality of sub-display panels 60 in one-to-one correspondence with the plurality of installation structures. Each of the sub-display panels 60 is installed on a respective installation structure 100. An edge of a side wall of the frame body 10 where the movable part 20 is not provided is substantially flush with an edge of a corresponding sub-display panel 60 located on the same side.

The edge of the side wall of the frame body 10 where the movable part 20 is not provided is substantially flush with the edge of the corresponding sub-display panel 60 located on the same side, which means the edge of the side wall of the frame body 10 where the movable part 20 is not provided is flush with the edge of the corresponding sub-display panel 60 located on the same side, or there is a small distance between the edge of the side wall of the frame body 10 where the movable part 20 is not provided and the edge of the corresponding sub-display panel 60 located on the same side. For example, the distance may be less than 0.3 mm, less than 0.2 mm, or less than 0.1 mm.

In some embodiments, one of two adjacent installation structures has a first side wall, and the other one has a second side wall abutting the first side wall, and one of the first side wall and the second side wall is provided with the movable part 20 on an outer side thereof, and the other one of the first side wall and the second side wall is not provided with the movable part 20 on an outer side thereof. In this way, there may be a small gap or no gap between adjacent sub-display panels 60.

In some embodiments, the minimum distance between the edge of the frame body 10 and the edge of the corresponding sub-display panel 60 located on the same side may range from 0.1 mm to 0.5 mm. In this way, a distance of the movable part 20 to be adjusted is small, which may facilitate the adjustment process.

The sub-display panel 60 may include an array substrate 61 and a plurality of light-emitting elements 62 provided on the array substrate 61. The array substrate 61 may include a glass substrate and a drive circuit provided on the glass substrate.

The tiled display 200 may further include a housing 77. The housing 77 may be provided with a support 771. The support 771 may be provided with a third magnetic member 782 on the top thereof. The frame body 10 may be provided with a fourth magnetic member 781 on the bottom thereof. The support 771 may be attached to the frame body 10 through the third magnetic member 782 and the fourth magnetic member 781.

The tiled display 200 may further include a circuit board 71, a chip 72, a cable 73, a battery 74, a flexible circuit board 75, and a hub 76. The circuit board 71 may be bonded to the bottom of the sub-display panel 60 by an adhesive layer. The flexible circuit board 75 may be bound to the array substrate of the sub-display panel 60 at one end and electrically connected with the circuit board 71 at the other end, e.g., in a pluggable manner, and drive signals and drive voltages from the circuit board 71 may be transmitted to the sub-display panel 60 through the flexible circuit board 75. The chip 72 may be bound to the circuit board 71. The circuit board 71 may be connected to the hub 76 via the cable 73. The battery 74 may supply power to the chip 72, the circuit board 71, the flexible circuit board 75 and the sub-display panel 60.

Those skilled in the art will easily conceive of other embodiments of the present disclosure after considering the specification and practicing the disclosure disclosed herein. The present disclosure is intended to cover any variations, uses or adaptive changes of the present disclosure. These variations, uses or adaptive changes follow the general principles of the present disclosure and include common knowledge or conventional technical means in the art that are not disclosed by the present disclosure. The specification and the embodiments are to be regarded as exemplary only, and the true scope and spirit of the present disclosure are pointed out by the following claims.

It should be understood that the present disclosure is not limited to the precise structure that has been described above and shown in the drawings, and various modifications and changes may be made without departing from the scope thereof. The scope of the present disclosure is only limited by the appended claims.

The invention claimed is:

1. An installation structure for a tiled display, the tiled display comprising a plurality of sub-display panels each of which is installed on a respective installation structure, and the installation structure comprising:
   a frame body, on which a corresponding sub-display panel is installed;
   a movable part provided on an outer side of the frame body; and
   an adjustment rod, an end of which penetrates through the frame body and cooperates with the movable part,
   wherein the adjustment rod is rotatable relative to the frame body, and rotation of the adjustment rod can drive the movable part to move close to or away from the frame body, and
   wherein when the plurality of sub-display panels are tiled together, one of two adjacent installation structures has a first side wall, and the other one of the two adjacent installation structures has a second side wall abutting the first side wall, and one of the first side wall and the second side wall is provided with the movable part, and the other one of the first side wall and the second side wall is not provided with the movable part.

2. The installation structure according to claim 1, wherein the frame body is provided with a recess in a side wall opposite to the movable part, and a portion of the movable part can enter the recess.

3. The installation structure according to claim 2, wherein the recess has a depth ranging from 3 mm to 10 mm; and/or
   a ratio of the depth of the recess to a size of a portion of the frame body where the recess is provided in a depth direction of the recess ranges from 40% to 60%; and/or
   a ratio of a length of the movable part to a size of the frame body in a length direction of the movable part ranges from 70% to 90%.

4. The installation structure according to claim 1, wherein the adjustment rod is threadedly connected with the frame body, and the adjustment rod is threadedly connected with the movable part, and
   the movable part is circumferentially limited relative to the frame body.

5. The installation structure according to claim 1, wherein the adjustment rod is threadedly connected with the frame body, and an end of the adjustment rod is inserted into the movable part, and
   the adjustment rod cooperates with the movable part such that the adjustment rod is rotatable relative to the movable part, and the adjustment rod is limited in an extension direction of the adjustment rod relative to the movable part.

6. The installation structure according to claim 5, wherein a first magnetic member is provided on a side wall of the movable part opposite to the frame body, and a second magnetic member is provided on a side wall of the frame body opposite to the movable part, and the first magnetic member and the second magnetic member are disposed opposite to each other, and the first magnetic member and the second magnetic member have a magnetic attraction therebetween.

7. The installation structure according to claim 1, wherein the movable part is provided on an outer side of each of two adjacent side walls of the frame body.

8. The installation structure according to claim 1, wherein the adjustment rod comprises two or more adjustment rods, and a distance between two adjacent adjustment rods ranges from 50 mm to 100 mm.

9. A tiled display, comprising:
a plurality of installation structures; and
a plurality of sub-display panels in one-to-one correspondence with the plurality of installation structures, each of the sub-display panels being installed on a respective installation structure,
wherein each of the installation structures comprises:
a frame body, on which a corresponding sub-display panel is installed;
a movable part provided on an outer side of the frame body; and
an adjustment rod, an end of which penetrates through the frame body and cooperates with the movable part,
wherein the adjustment rod is rotatable relative to the frame body, and rotation of the adjustment rod can drive the movable part to move close to or away from the frame body,
an edge of a side wall of the frame body where the movable part is not provided is substantially flush with an edge of the corresponding sub-display panel located on a same side, and
one of two adjacent installation structures has a first side wall, and the other one of the two adjacent installation structures has a second side wall abutting the first side wall, and one of the first side wall and the second side wall is provided with the movable part, and the other one of the first side wall and the second side wall is not provided with the movable part.

10. The tiled display according to claim 9, wherein the frame body is provided with a recess in a side wall opposite to the movable part, and a portion of the movable part can enter the recess.

11. The tiled display according to claim 10, wherein
the recess has a depth ranging from 3 mm to 10 mm; and/or
a ratio of the depth of the recess to a size of a portion of the frame body where the recess is provided in a depth direction of the recess ranges from 40% to 60%; and/or
a ratio of a length of the movable part to a size of the frame body in a length direction of the movable part ranges from 70% to 90%.

12. The tiled display according to claim 9, wherein
the adjustment rod is threadedly connected with the frame body, and the adjustment rod is threadedly connected with the movable part, and
the movable part is circumferentially limited relative to the frame body.

13. The tiled display according to claim 9, wherein
the adjustment rod is threadedly connected with the frame body, and an end of the adjustment rod is inserted into the movable part, and
the adjustment rod cooperates with the movable part such that the adjustment rod is rotatable relative to the movable part, and the adjustment rod is limited in an extension direction of the adjustment rod relative to the movable part.

14. The tiled display according to claim 13, wherein
a first magnetic member is provided on a side wall of the movable part opposite to the frame body, and a second magnetic member is provided on a side wall of the frame body opposite to the movable part, and
the first magnetic member and the second magnetic member are disposed opposite to each other, and the first magnetic member and the second magnetic member have a magnetic attraction therebetween.

15. The tiled display according to claim 9, wherein the movable part is provided on an outer side of each of two adjacent side walls of the frame body.

16. The tiled display according to claim 9, wherein the adjustment rod comprises two or more adjustment rods, and a distance between two adjacent adjustment rods ranges from 50 mm to 100 mm.

* * * * *